(12) United States Patent
Matsunaga (10) Patent No.: US 6,210,173 B1
(45) Date of Patent: Apr. 3, 2001

(54) ELECTRICAL CONNECTOR INCORPORATING AN ELASTIC ELECTRICALLY CONDUCTIVE MATERIAL

(75) Inventor: Hitoshi Matsunaga, Tokyo (JP)

(73) Assignee: Unitechno Inc., Tokyo (JP)

(*) Notice: Subject to any disclaimer, the term of this patent is extended or adjusted under 35 U.S.C. 154(b) by 0 days.

(21) Appl. No.: 09/344,719

(22) Filed: Jun. 25, 1999

(30) Foreign Application Priority Data

Jul. 1, 1998 (JP) .................................................. 10-186084

(51) Int. Cl.[7] .................................................. H01R 12/00
(52) U.S. Cl. .................. 439/66; 439/74; 439/86; 439/91; 439/591
(58) Field of Search .................. 439/66, 591, 67, 439/68, 74, 86, 91

(56) References Cited

U.S. PATENT DOCUMENTS

| | | | |
|---|---|---|---|
| 3,680,037 | * 7/1972 | Nellis et al. | 339/61 |
| 4,008,300 | * 2/1977 | Ponn | 264/104 |
| 5,174,766 | * 12/1992 | Yoshizawa et al. | 439/91 |
| 5,338,232 | * 8/1994 | Bernier | 439/733 |
| 5,477,086 | * 12/1995 | Rostoker et al. | 257/737 |
| 6,062,870 | * 5/2000 | Hopfer, III et al. | 439/66 |

* cited by examiner

*Primary Examiner*—Paula Bradley
*Assistant Examiner*—Truc Nguyen
(74) *Attorney, Agent, or Firm*—Ratner & Prestia (57) ABSTRACT

An electrical connector for interconnecting a first circuit such as an integrated circuit having a plurality of IC terminals with a second circuit having a plurality of contact pads when the terminals and pads are positioned opposite each other. The connector includes an electrically insulating sheet made of a first elastic material formed with a plurality of bores extending therethrough in a direction mutually perpendicular to the first and second circuits, and a plurality of electrical conductors, each made of a second, electrically conductive elastic material and shaped so as to contact the first circuit terminals. The elastic material electrical conductors are each positioned relative to the electrically insulating sheet so as to cover each of the bores and extend into the bore co-axially therewith. The elastic conductors are sized to extend into the bores a distance insufficient to contact the second circuit pads when the insulating elastic sheet is uncompressed, and sufficient to contact the second circuit pads when the elastic insulating sheet is compressed, thereby, upon compression of the sheet to complete an electric connection between the first circuit terminals and the second circuit pads.

18 Claims, 11 Drawing Sheets

ELECTRICAL CONNECTOR INCORPORATING AN ELASTIC ELECTRICALLY CONDUCTIVE MATERIAL

FIELD OF THE INVENTION

The present invention relates to a connector structure for electrically connecting electronic parts for testing the electronic parts, and more particularly to a connector structure for connecting an integrated circuit and an electronic circuit for testing the integrated circuit.

BACKGROUND OF THE INVENTION

The connector structure of this type is utilized to connect an integrated circuit having a plurality of IC terminals with an electronic circuit having a plurality of electronic pads respectively paired with the IC terminals of the integrated circuit to test the electronic performances of the integrated circuit before it is put on the market. The word "an integrated circuit" refers here to a semiconductor chip wafer, a semiconductor integrated circuit chip, and a semiconductor integrated circuit chip package. In order to test the integrated circuit, IC terminals of the integrated circuit are to be electrically connected with the electronic pads of the electronic circuit, respectively.

There have been provided various types of integrated circuits such as ball grid array types or fine-pitch ball grid array types. The IC terminals of such integrated circuit are formed with solder bumps and arrayed at one side of the integrated circuit. Because of the fact that the IC terminals of the integrated circuits are formed with solder bumps, the IC terminals of the integrated circuit may have different heights. This may cause some problems that the IC terminals of the integrated circuit partially cannot be electrically connected with the electronic pads of the electronic circuit when the integrated circuit is put on the electronic circuit to have each of the IC terminals face each of the electronic pads. The connector structure such as an IC socket, therefore, is utilized to connect the integrated circuit and the electronic circuit.

Figure 10:
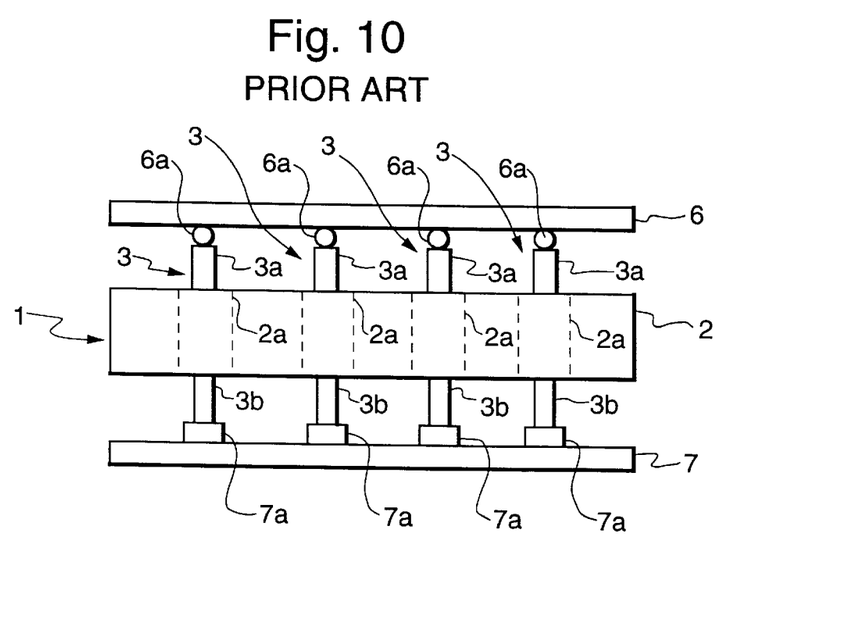
FIG. 10 is a plan view of a conventional IC socket.
Figure 11:
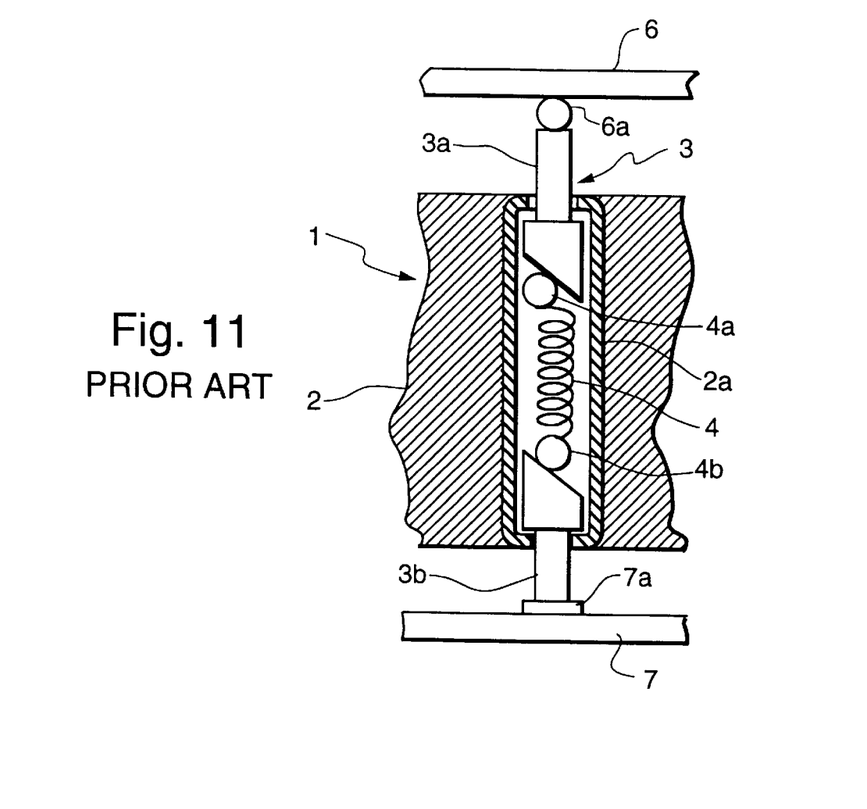
FIG. 11 is an enlarged fragmentary cross-sectional view of the conventional IC socket shown in FIG. 10.

There is shown in FIGS. 10 and 11 a primary example of a conventional IC socket 1 designed to connect an integrated circuit 6 and an electronic circuit 7. The integrated circuit 6 has a plurality of IC terminals 6a while the electronic circuit 7 has a plurality of electronic pads 7a each paired with the IC terminals 6a of the integrated circuit 6. As shown in FIG. 10, the IC socket 1 comprises a support portion 2 and a plurality of probe pins 3 each having first and second electrically conductive terminals 3a and 3b at its respective longitudinal ends. The support portion 2 of the IC socket 1 is formed with a plurality of through bores 2a having each of the probe pins 3 respectively received therein. The IC socket 1 is positioned between the integrated circuit 6 and the electronic circuit 7 to electrically connect the integrated circuit 6 and the electronic circuit 7. Under these conditions, the integrated circuit 6 is urged toward the electronic circuit 7 by urging means (not shown in the drawings), to ensure the connections between the integrated circuit 6 and the electronic circuit 7 by way of the IC socket 1.

FIG. 11 shows one of the probe pins 3 in detail. The probe pin 3 herein shown comprises a coil spring 4 having first and second contact balls 4a and 4b at its both ends to be respectively held in contact with the first and second terminals 3a and 3b of the probe pin 3. The first and second terminals 3a and 3b of the probe pins 3 are respectively held in contact with the IC terminals 6a of the integrated circuit 6 and the electronic pads 7a of the electronic circuit 7. The coil spring 4 enables to withstand the force generated on the IC socket 1 by the urging means which is urging the integrated circuit 6 toward the electronic circuit 7.

The conventional IC socket 1, however, cannot meet requirements of recently designed integrated circuits to the effect that each of the integrated circuits should have terminals arranged at an extremely short interval.

Moreover, the curved line distance between the integrated circuit 6 and the electronic circuit 7 caused by the coil spring 4 is much longer than the straight line distance between the integrated circuit 6 and the electronic circuit 7. This difference in distance may bring about errors on the results of the test especially when the electronic performances of the integrated circuit are tested.

Furthermore, the coil spring 4 to generate electromagnetic induction is liable to cause an undesirable effect on the results of the test.

Figure 12:
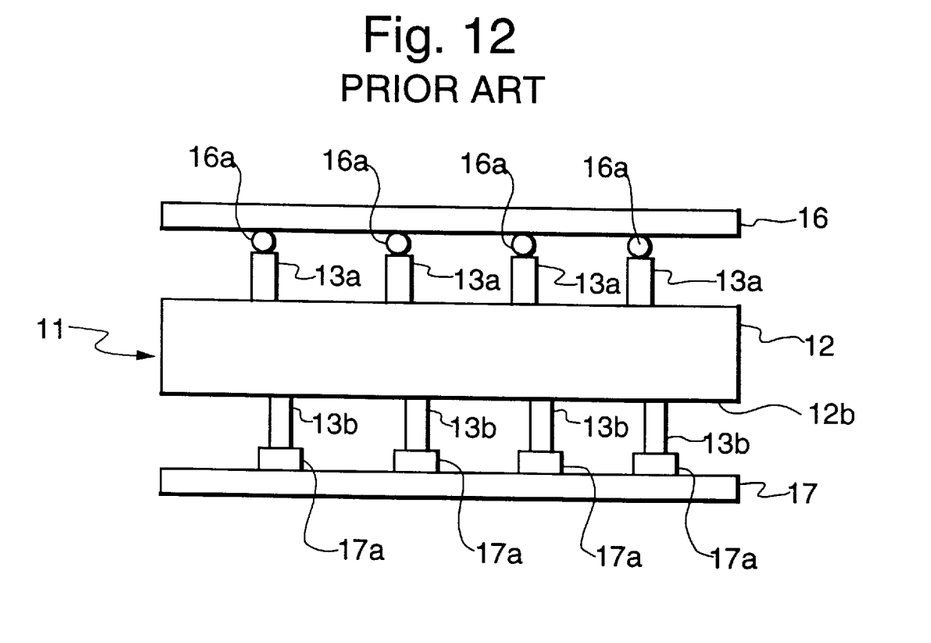
FIG. 12 is a plan view of another conventional IC socket.
Figure 13:
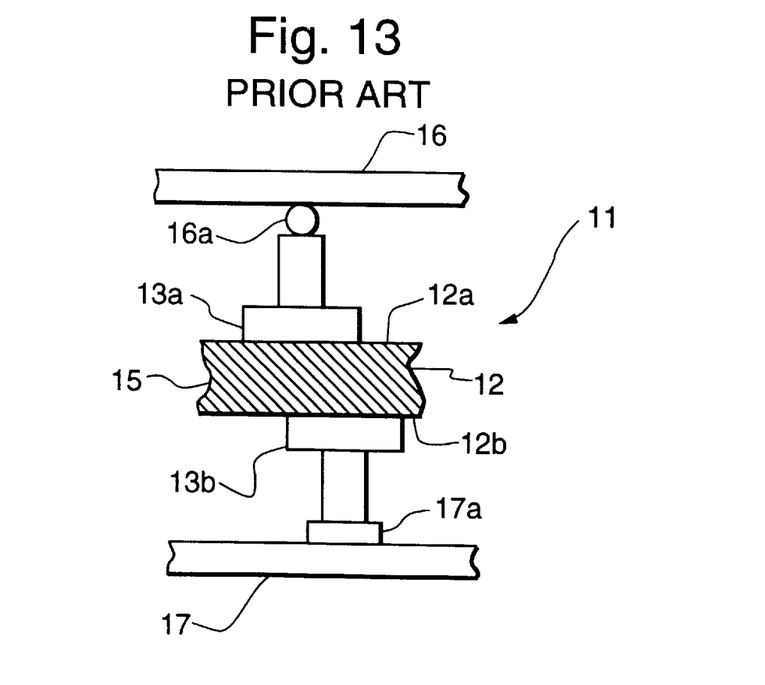
FIG. 13 is an enlarged fragmentary cross-sectional view of the conventional IC socket shown in FIG. 12.

Another example of a conventional IC socket 11 designed to connect an IC 16 and an electronic circuit 17 is shown in FIGS. 12 and 13. The IC socket 11 comprises a support portion 12 having a predetermined thickness and formed with upper and lower surfaces 12a and 12b substantially extending in parallel relationship with each other, and a plurality of first and second terminals 13a and 13b.

FIG. 13 partly shows the IC socket 11. The support portion 12 is made of an insulating rubber such as a silicon rubber and has a plurality of electrically conductive wires 15 each embedded in the support portion 12 in inclined relationship to the upper and lower surfaces 12a and 12b to be spaced apart from each other at a predetermined small pitch. The first and second terminals 13a and 13b are respectively positioned on upper and lower surfaces 12a and 12b of the support portion 12 with their center axes dislocated from each other to have received therebetween some of the electrically conductive wires 15. The electrically conductive wires 15 spaced apart from each other at the predetermined small pitch results in each of the first and second terminals 13a and 13b of the IC socket 11 being kept insulated from the adjacent first and second terminals 13a and 13b, respectively.

The IC socket 11 shown in FIG. 13 is positioned between an integrated circuit 16 and an electronic circuit 17 to electrically connect the integrated circuit 16 and the electronic circuit 17. Under these conditions, the integrated circuit 16 is urged toward the electronic circuit 17 by urging means (not shown in the drawings), to ensure the connection between the integrated circuit 16 and the electronic circuit 17 by way of the IC socket 11. The support portion 12 and each of the electrically conductive wires 15 embedded in the support portion 12 in inclined relationship with the upper and lower surfaces 12a and 12b of the support portion 12 enables the IC socket 11 to withstand the force generated by the urging means which is urging the integrated circuit 16 toward the electronic circuit 17.

The conventional IC socket 11, however, cannot meet the requirements of recently designed integrated circuits to the effect that each of the integrated circuits should have terminals arranged at an extremely short interval.

Moreover, the first and second terminals 13a and 13b respectively positioned on upper and lower surfaces 12a and 12b of the support portion 12 with their center axes dislocated from each other to have some of the electrically conductive wires 15 which are in inclined relationship with the upper and lower surfaces 12a and 12b of the support portion 12 received therebetween. This structure of the IC socket 11 is complex in structure and thus makes it difficult to have a number of terminals in a small space.

SUMMARY OF THE INVENTION

It is therefore an object of the present invention to provide a connector structure, such as an IC socket, for connecting electronic parts, particularly an integrated circuit and an electronic circuit, for testing the electronic parts.

According to a first aspect of the present invention, there is provided a connector structure for electrically connecting a pair of electric parts each having a plurality of terminals which can be electrically connected when the electric parts are arranged with the terminals facing and spaced apart from each other, comprising: an electrically insulating elastic sheet made of an elastic material, and formed with a plurality of through bores respectively facing and spaced apart from the terminals of the pair of electronic parts, each of the through bores having an center axis; and a plurality of electrically insulating elastic bodies each made of an elastic material and each positioned with respect to the electrically insulating elastic sheet to cover each of the through bores of the electrically insulating elastic sheet, the electrically insulated elastic sheet being deformable to have the electrically conductive elastic bodies displaced with respect to the terminals of the electric parts along the center axis of each of the thorough bores between a first position where the electrically conductive elastic bodies are respectively spaced apart from the terminals of at least one of the electric parts and a second position where the electrically conductive elastic bodies are respectively held in electrical contact with the terminals of the electric parts to complete electrical connection between the electric parts.

Each of the electrically conductive elastic bodies of the connector structure may have a portion protruding toward one of the electric parts to facilitate each of the electrically conductive elastic bodies to be brought into contact with each of the terminals of one of the electric parts when the electrically conductive elastic bodies are displaced with respect to the terminals of at least one of the electric parts to assume the second position.

Each of the electrically conductive elastic bodies of the connector structure may be formed with a concavity having each of the terminals of the other of the electric parts received therein.

Each of the electrically conductive elastic bodies of the connector structure may be formed with a convexity held in contact with each of the terminals of the other of the electric parts.

Each of the terminals of the other of the electric parts may be formed with a concavity, and each of the electrically conductive elastic bodies may be formed with a convexity identical in profile to the concavity of each of the terminals so that the protruding portion of each of the electrically conductive elastic bodies is received in and registered with the cavity of each of the terminals of the other of the electric parts.

One of the electronic parts may be a semiconductor integrated circuit chip package, a semiconductor chip wafer or a semiconductor integrated circuit chip.

According to a second aspect of the present invention there is provided a connector structure for electrically connecting a pair of electric parts each having a plurality of terminals which can be electrically connected when the electric parts are arranged with the terminals facing and spaced apart from each other, comprising: an electrically insulating elastic sheet having a plurality of projecting portions facing and spaced apart from one of the terminals of the pair of electronic parts, each of the projecting portions being formed with a through bore having a center axis; and a plurality of electrically conductive elastic bodies positioned with respect to the electrically insulating elastic sheet to cover each of the through bores of the electrically insulating elastic sheet, the electrically conductive elastic bodies being displaceable with respect to the terminals of the electric parts along the center axis of each of the thorough bores between a first position where the electrically conductive elastic bodies are respectively spaced apart from the terminals of at least one of the electric parts and a second position where the electrically conductive elastic bodies are respectively held in electrical contact with the terminals of the electric parts to complete electrical connection between the electric parts.

Each of the electrically conductive elastic bodies of the connector structure may have a portion protruding toward one of the electric parts to facilitate each of the electrically conductive elastic bodies to be brought into contact with each of the terminals of one of the electric parts when the electrically conductive elastic bodies are displaced with respect to the terminals of at least one of the electric parts to assume the second position.

Each of the electrically conductive elastic bodies of the connector structure may be formed with a concavity having each of the terminals of the other of the electric parts received therein.

Each of the electrically conductive elastic bodies of the connector structure may be formed with a convexity held in contact with each of the terminals of the other of the electric parts.

Each of the terminals of the other of the electric parts may be formed with a concavity, and each of the electrically conductive elastic bodies may be formed with a convexity identical in profile to the concavity of each of the terminals so that the protruding portion of each of the electrically conductive elastic bodies is received in and registered with the cavity of each of the terminals of the other of the electric parts.

One of the electronic parts may be a semiconductor integrated circuit chip package, a semiconductor chip wafer or a semiconductor integrated circuit chip.

BRIEF DESCRIPTION OF THE DRAWINGS

The features and advantages of the connector structure according to the present invention will be more clearly understood from the following description taken in conjunction with the accompanying drawings in which.

DESCRIPTION OF THE PREFERRED EMBODIMENTS

The first preferred embodiment of the connector structure according to the present invention will be described hereinafter with reference to the drawings, particularly to FIGS. 1, 2, 3 and 4.

FIGS. 1 to 4 partly show a connector structure 20 which is designed to electrically connect an integrated circuit 30 including a semiconductor integrated circuit chip having a plurality of spherical solder bumps or chip pads, and a semiconductor integrated circuit chip package of ball grid array having a plurality of IC terminals, with an electronic circuit 40 having a plurality of electronic pads 41. The connector structure 20 may be applied to a semiconductor chip wafer in which each of the semiconductor chip mounted on the wafer has a plurality of spherical solder bumps or chip pads. The integrated circuit 30 and the electronic circuit 40 constitute a pair of electronic parts according to the present invention.

The connector structure 20 comprises an electrically insulating elastic sheet 21 and a plurality of electrically conductive elastic bodies 22. The electrically elastic sheet 21 and each of the electrically conductive elastic bodies 22 are made of elastic materials each having a predetermined thickness.

Figure 1:
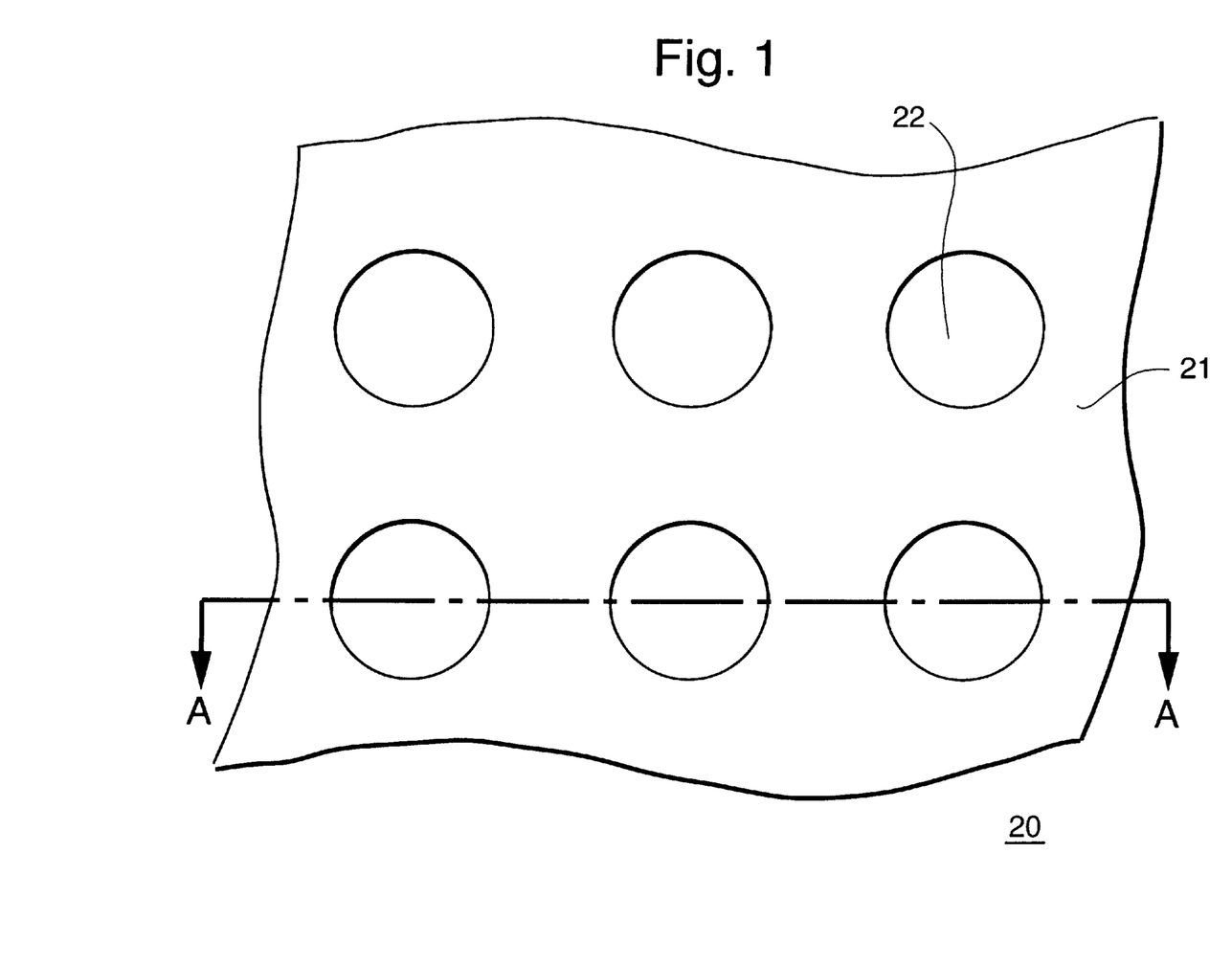
FIG. 1 is a top view of the connector structure according to the present invention.
Figure 2:
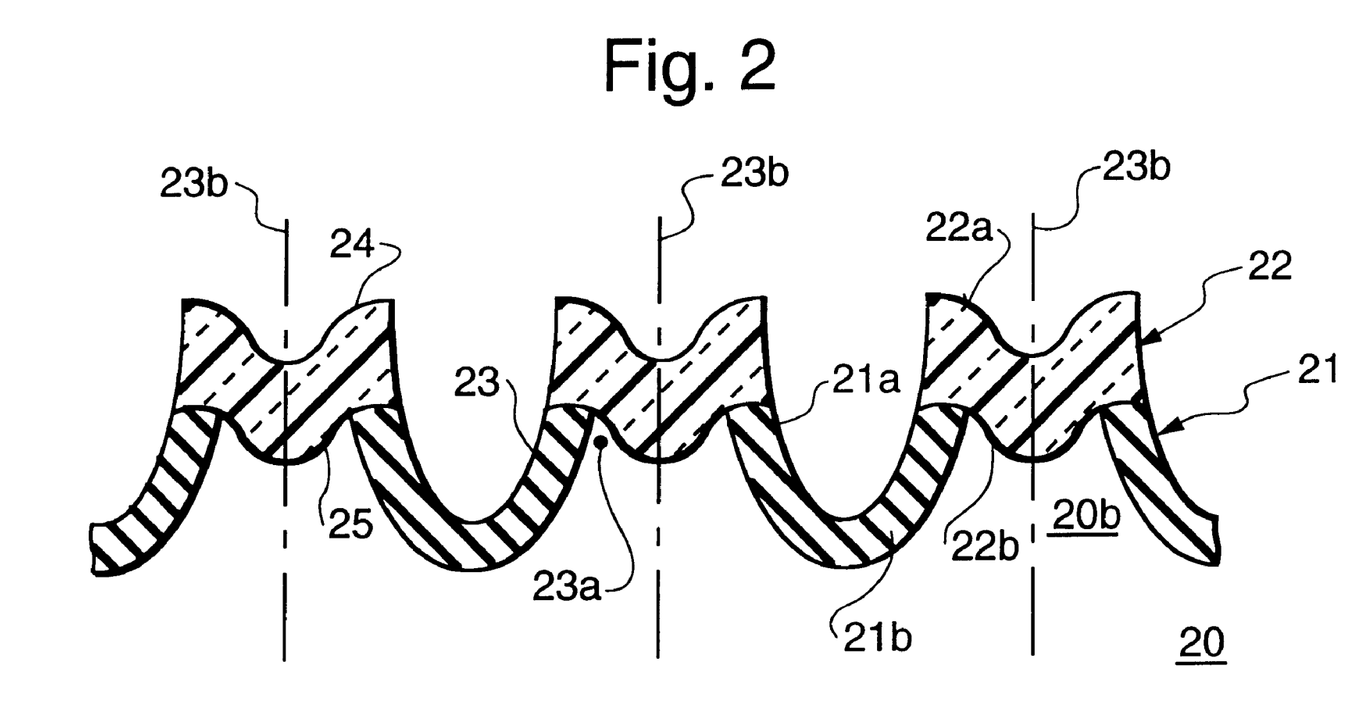
FIG. 2 is a cross-sectional view of a first preferred embodiment of the connector structure taken on line A—A of FIG. 1 according to the present invention.
Figure 3:
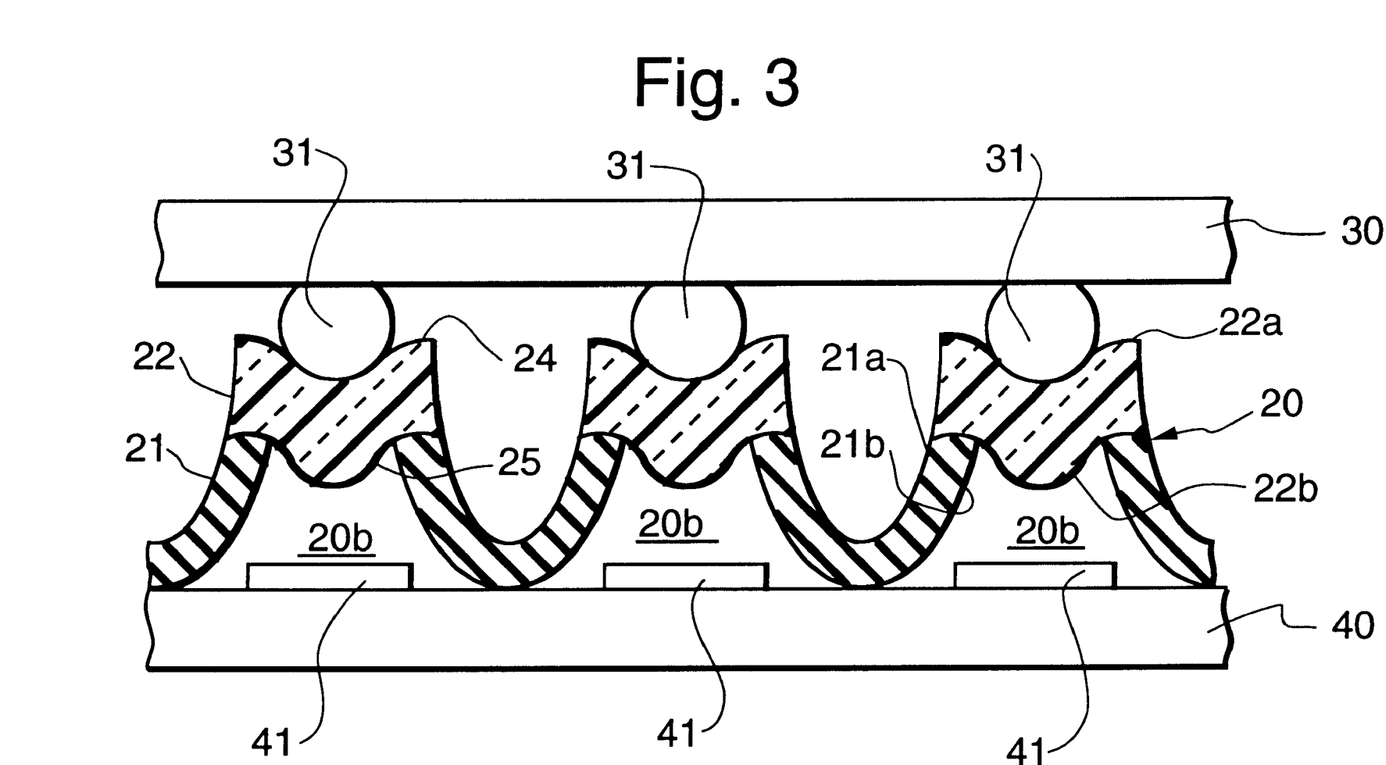
FIG. 3 illustrates the connector structure shown in FIG. 2 with an integrated circuit and an electronic circuit having the connector structure intervene therebetween.
Figure 4:
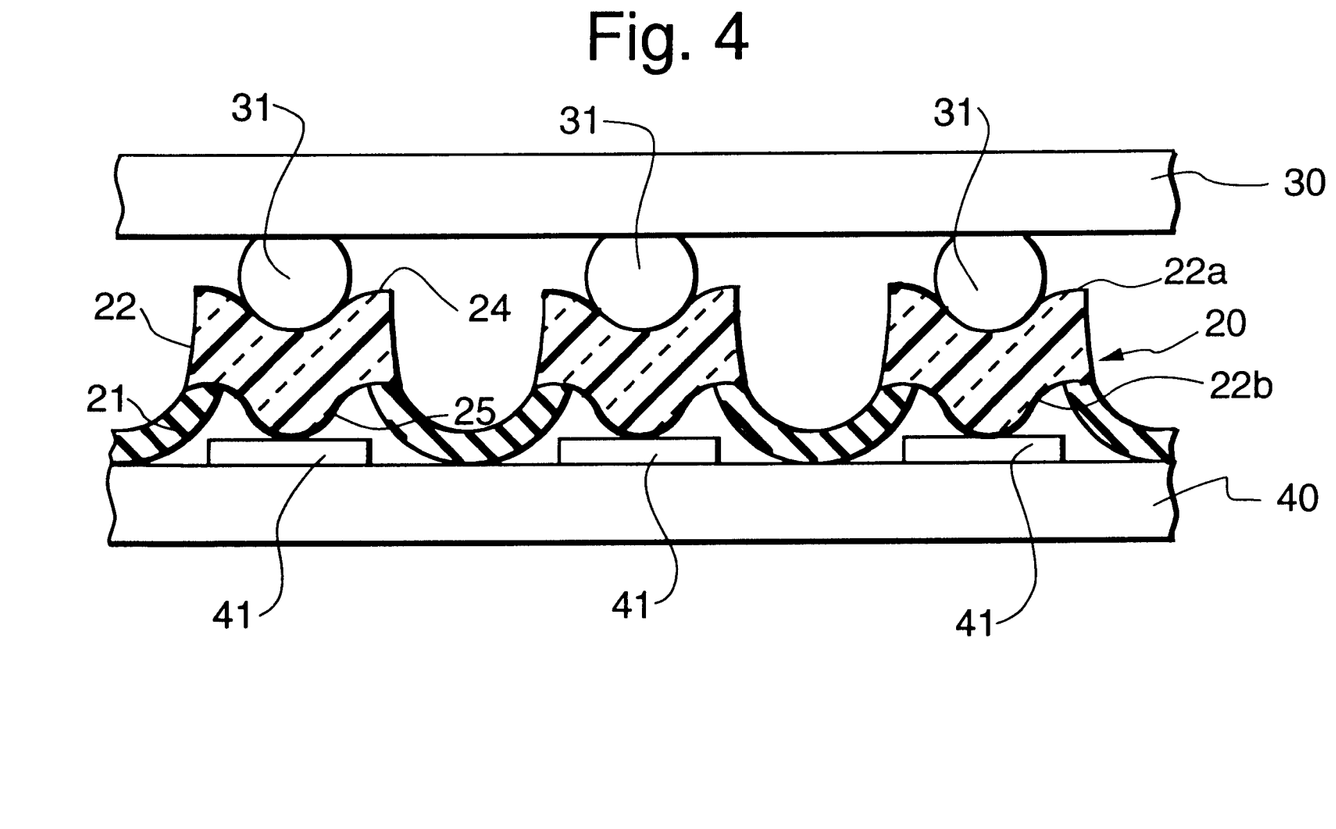
FIG. 4 illustrates the connector structure shown in FIG. 2 with the integrated circuit and the electronic circuit having the connector structure intervene therebetween and being urged toward each other.

As shown in FIG. 2, the electrically insulated elastic sheet 21 has upper and lower surfaces 21a and 21b, and formed with a plurality of projected portions 23 projected upwardly so as to respectively face the IC terminals 31 of the integrated circuit 30 shown in FIGS. 3 and 4. Each of the projecting portions 23 is formed with a through bore 23a having an axis 23b extending in substantially parallel relationship with the thickness of the electrically insulating elastic sheet 21. Each of the electrically conductive elastic bodies 22 has upper and lower surfaces 22a and 22b, and is formed with a concavity 24 open at the upper surface 22a and a protruding portion 25 protruded downwardly in FIG. 2 and away from the concavity 24.

The electrically conductive elastic bodies 22 are substantially identical in structure to each other, and the projected portions 23 of the electrically elastic sheet 21 are similarly substantially identical in shape to each other. This means that only one of the electrically conductive elastic bodies 22 and only one of the projected portions 23 of the electrically insulating elastic sheet 21 will be described hereinafter.

The electrically conductive elastic body 22 is positioned with respect to the electrically insulating elastic sheet 21 to cover the through bore 23a of the electrically insulating elastic sheet 21. The electrically conductive elastic body 22 is thus supported by the projected portion 23 of the electrically insulating elastic sheet 21 with the lower surface 22b of the electrically conductive elastic body 22 and the lower surface 21b of the electrically insulating elastic sheet 21 forming a lower cavity 20b.

The electrically conductive elastic bodies 22 are bonded with the electrically insulating elastic sheet 21 by molding, cementing, welding, fusion welding, depositing processes and the like.

Referring now to FIGS. 3 and 4, the connector structure 20 is arranged between the integrated circuit 30 and the electronic circuit 40. The electrically conductive elastic bodies 22 of the connector structure 20 formed as above described are respectively displaceable with respect to the electronic pads 41 of the electronic circuit 40 along the center axes 23b of the thorough bores 23a between a first position where the electrically conductive elastic bodies 22 are respectively held in contact with the IC terminals 31 of the integrated circuit 30 and spaced apart from the electronic pads 41 of the electric circuit 40, and a second position where the electrically conductive elastic bodies 22 are respectively held in electrical contact with the IC terminals 31 of the integrated circuit 30 and the electronic pads 41 of the electronic circuit 40 to complete electrical connection between the integrated circuit 30 and the electronic circuit 40.

FIG. 3 shows the first position of the connector structure 20 in which the IC terminals 31 of the integrated circuit 30 are respectively received in the concavities 24 of the electrically conductive elastic bodies 22 of the connector structure 20. Under this state, the electrically conductive elastic bodies 22 are supported by the electrically insulating elastic sheet 21 to have their protruding portions 25 respectively face and spaced apart from the electronic pads 41 of the electronic circuit 40. This means that the IC terminals 31 of the integrated circuit 30 and the electronic pads 41 of the electronic circuit 40 are not electrically connected with each other.

When the integrated circuit 30 is urged toward the electronic circuit 40 from the above state, the connector structure 20 assumes the second position as shown in FIG. 4. While the integrated circuit 30 is moved toward the electronic circuit 40, the electrically insulating elastic sheet 21 is deformed to have the electrically conductive elastic bodies 22 displaced with respect to and brought into contact with the electronic pads 41 of the electronic circuit 40, respectively. It is thus to be noted that the IC terminals 31 of the integrated circuit 30 and the electronic pads 41 of the electronic circuit 40 can electrically be connected with each other by the deformable electrically conductive elastic bodies 22.

The second preferred embodiment of the connector structure according to the present invention will be described hereinafter with reference to the drawings, 5 particularly to FIGS. 5, 6 and 7.

Figure 5:
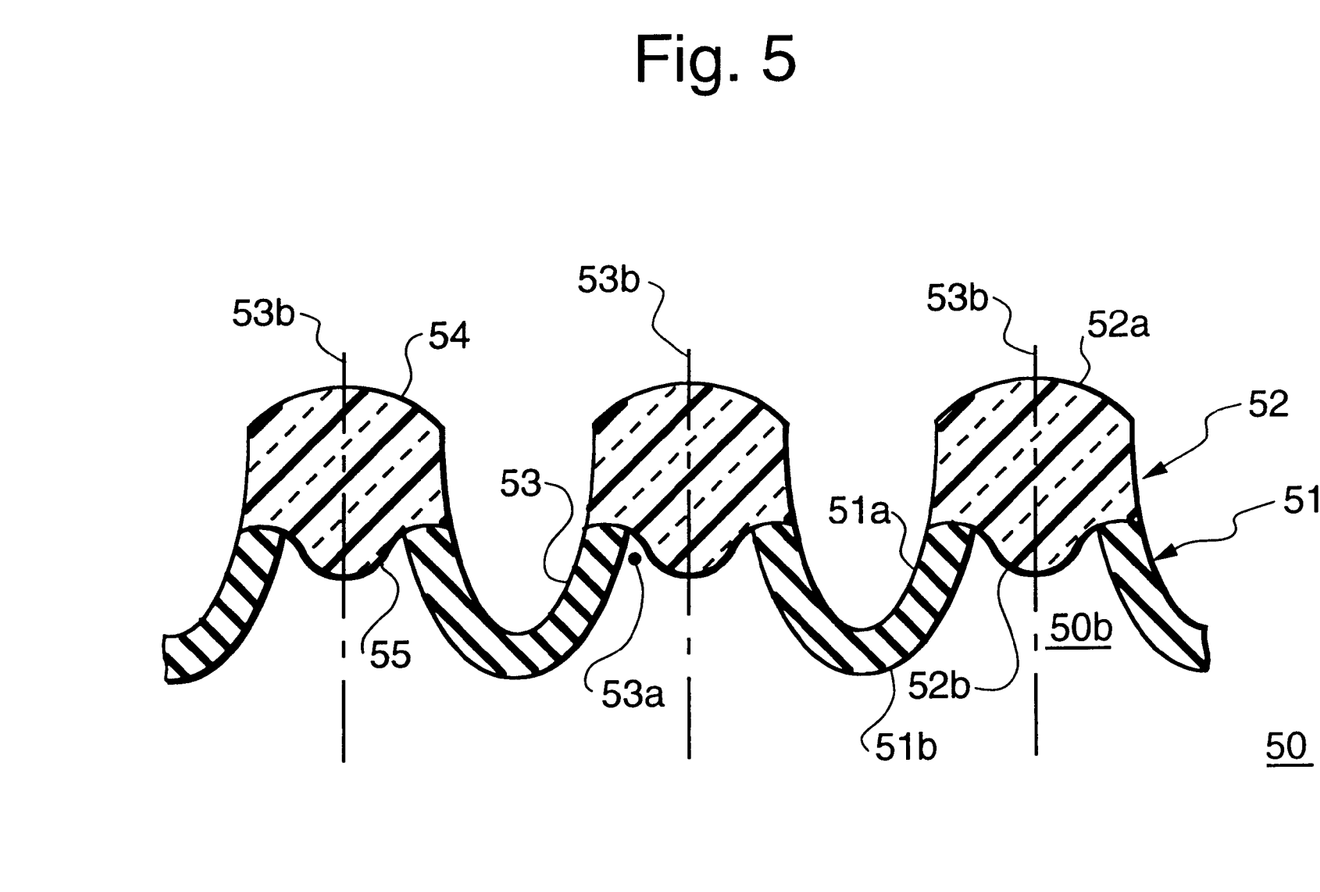
FIG. 5 is a cross-sectional view of a second preferred embodiment of the connector structure according to the present invention.
Figure 6:
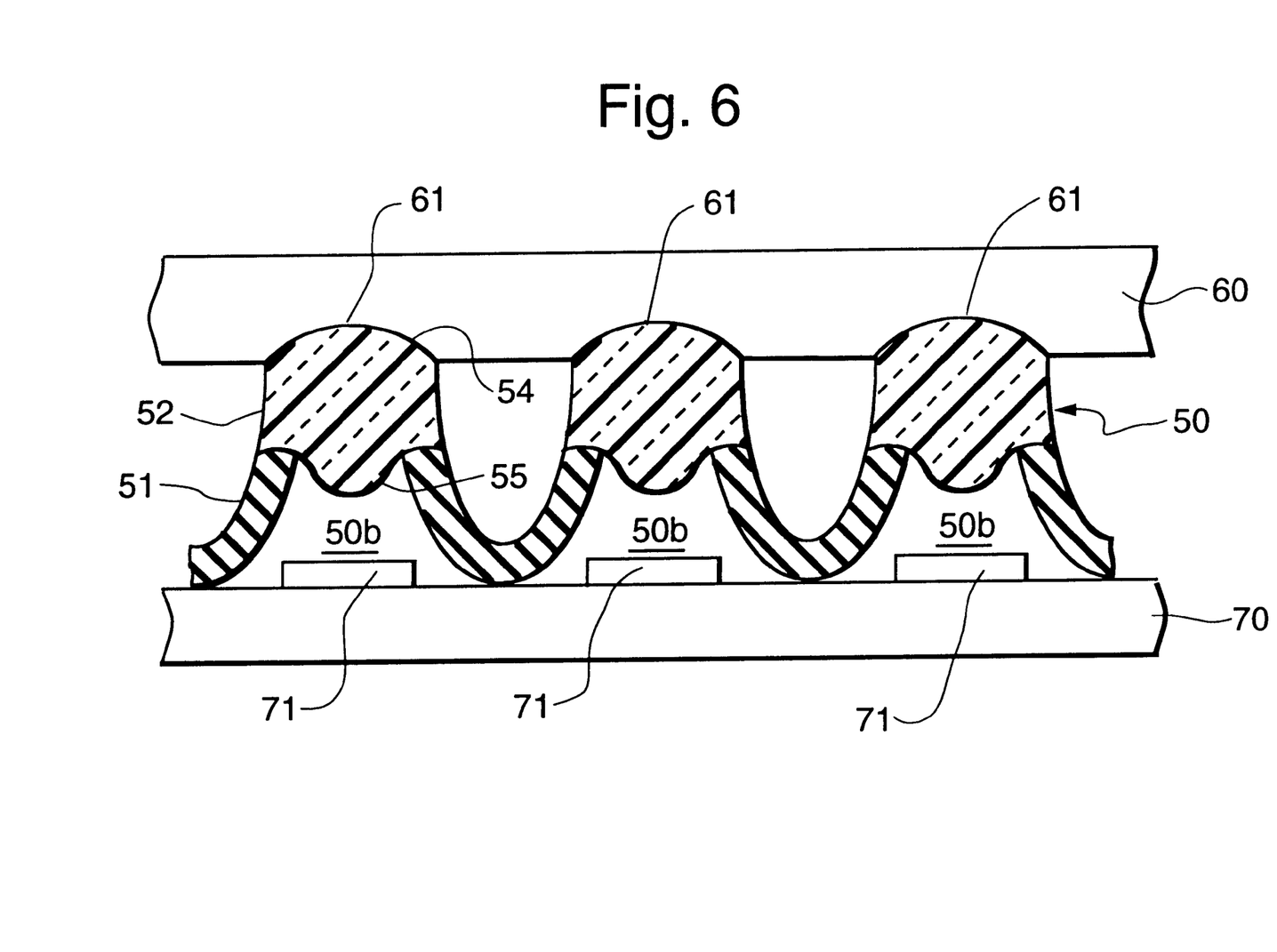
FIG. 6 illustrates the connector structure shown in FIG. 5 with a integrated circuit and an electronic circuit having the connector structure intervene therebetween.
Figure 7:
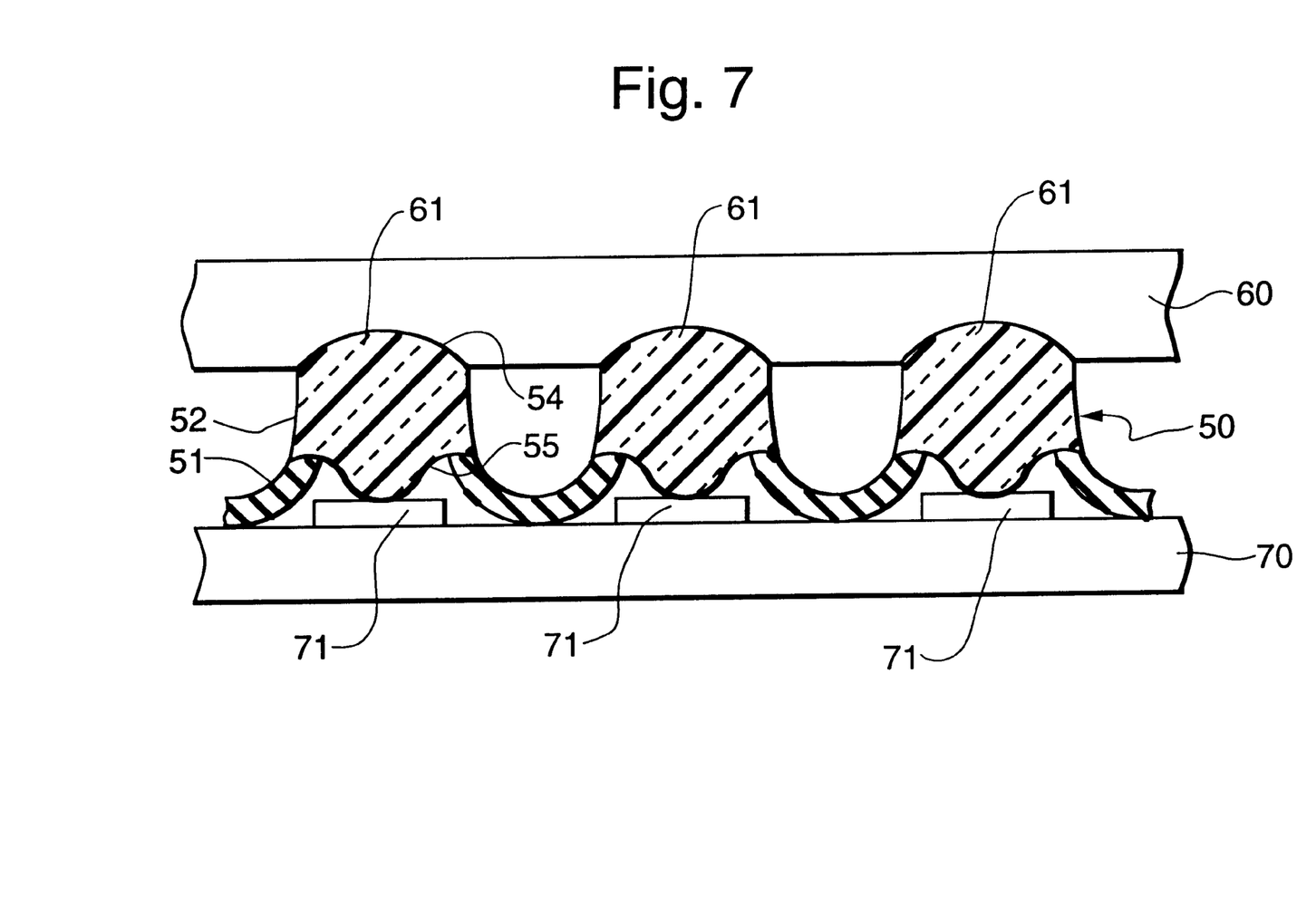
FIG. 7 illustrates the connector structure shown in FIG. 5 with the integrated circuit and the electronic circuit having the connector structure intervene therebetween and being urged toward each other.

FIGS. 5 to 7 partly show a connector structure 50 which is designed to electrically connect an integrated circuit 60 including a semiconductor integrated circuit chip having a plurality of solder bumps or chip pads, and a semiconductor integrated circuit chip package of long grid array having a plurality of IC terminals, with an electronic circuit 40 having a plurality of electronic pads 41. The connector structure 50 may be applied to a semiconductor chip wafer in which each of the semiconductor chip mounted on the wafer has a plurality of solder bumps or chip pads. The integrated circuit 60 and the electronic circuit 70 constitute a pair of electronic parts according to the present invention.

The connector structure 50 comprises an electrically insulating elastic sheet 51 and a plurality of electrically conductive elastic bodies 22. The electrically insulating elastic sheet 51 and the plurality of electrically conductive elastic bodies 52 are made of elastic materials each having a predetermined thickness.

As shown in FIG. 5, the electrically insulating elastic sheet 51 has upper and lower surfaces 51a and 51b, and formed with a plurality of projected portions 53 projected upwardly so as to respectively face the IC terminals 61 of the integrated circuit 60 shown in FIGS. 6 and 7. Each of the projected portions 53 is formed with a through bore 53a having an axis 53b extending in substantially parallel relationship with the thickness of the electrically insulating elastic sheet 51. Each of the electrically conductive elastic bodies 52 has upper and lower surfaces 52a and 52b, and is formed with a convexity 54 swollen upwardly and a protruding portion 55 protruded downwardly in FIG. 5 and away from the convexity 54.

The electrically conductive elastic bodies 52 are substantially identical in structure to each other, and the projected portions 53 of the electrically insulating elastic sheet 51 are similarly substantially identical in shape to each other. This means that only one of the electrically conductive elastic bodies 52 and only one of the projected portions 53 of the electrically insulating elastic sheet 51 will be described hereinafter.

The electrically conductive elastic body 52 is positioned with respect to the electrically insulating elastic sheet 51 to cover the through bore 53a of the electrically insulating elastic sheet 51. The electrically conductive elastic body 52 is thus supported by the projected portion 53 of the electrically insulating elastic sheet 51 with the lower surface 52b of the electrically conductive elastic body 52 and the lower surface 51b of the electrically insulated elastic sheet 51 forming a lower cavity 50b.

The electrically conductive elastic bodies 52 are bonded with the electrically insulating elastic sheet 51 by molding, cementing, welding, fusion welding, depositing processes and the like.

Referring now to FIGS. 6 and 7, the connector structure 50 is arranged between the integrated circuit 60 and the electronic circuit 70. The electrically conductive elastic body 52 of the connector structure 50 formed as above described is displaceable with respect to the electronic pads 71 of the electronic circuit 70 along the center axis 53b of each of the thorough bores 53a between a first position where the electrically conductive elastic bodies 52 are respectively held in contact with the IC terminals 61 of the integrated circuit 60 and spaced apart from the electronic pads 71 of the electric circuit 70, and a second position where the electrically conductive elastic bodies 52 are respectively held in electrical contact with the IC-terminals 61 of the integrated circuit 60 and the electronic pads 71 of the electronic circuit 70 to complete electrical connection between the integrated circuit 60 and the electronic circuit 70.

FIG. 6 shows the first position of the connector structure 50. Each of the IC terminals 61 of the integrated circuit 60 is formed with a concavity to have each of the electrically conductive elastic bodies 52 of the connector structure 50 received therein and registered therewith. Under this state, the electrically conductive elastic bodies 52 are supported by the electrically insulating elastic sheet 51 to have their protruding portions 55 respectively face and spaced apart from the electronic pads 71 of the electronic circuit 70. This means that the IC terminals 61 of the integrated circuit 60 and the electronic pads 71 of the electronic circuit 70 are not electrically connected with each other.

When the integrated circuit 60 is urged toward the electronic circuit 70 from the above state, the connector structure 50 assumes the second position as shown in FIG. 7. While the integrated circuit 60 is moved toward the electronic circuit 70, the electrically insulating elastic sheet 51 is deformed to have the electrically conductive elastic bodies 52 displaced with respect to and brought into contact with the electronic pads 71 of the electronic circuit 70, respectively. It is thus to be noted that the IC terminals 61 of the integrated circuit 60 and the electronic pads 71 of the electronic circuit 70 can electrically be connected with each other by the deformable electrically conductive elastic bodies 52.

The connector structures 20 and 50 according to the present invention are simple in construction, compared with the conventional IC socket 11 shown in FIGS. 12 and 13 by the reason that the connector structures 20 and 50 do not require the electrically conductive wires 15 and the first and second terminals 13a and 13b having the conductive wires 15 intervene therebetween. This results in the fact that the connector structures 20 and 50 are capable of having a plurality of terminals accommodated in a small space to test an integrated circuit which is small in size as well as of arranging a plurality of IC terminals in a extremely small space.

Moreover, the electrically conductive elastic bodies 22 of the connector structure 20 can respectively receive the IC terminals 31 of the integrated circuit 30 in their concavities 24 to protect the IC terminals 31 of the integrated circuit 30 from being damaged under the state that the IC terminals 31 of the integrated circuit 30 are held in contact with the electrically conductive elastic bodies 22

Furthermore, the convexity 54 of each of the electrically conductive elastic bodies 52 of the connector structure 50 can respectively be received in and registered with the concavity of each of the IC terminals 61 of the integrated circuit 60 to ensure electrical connection between the integrated circuit 60 and the connector structure 50.

Figure 8:
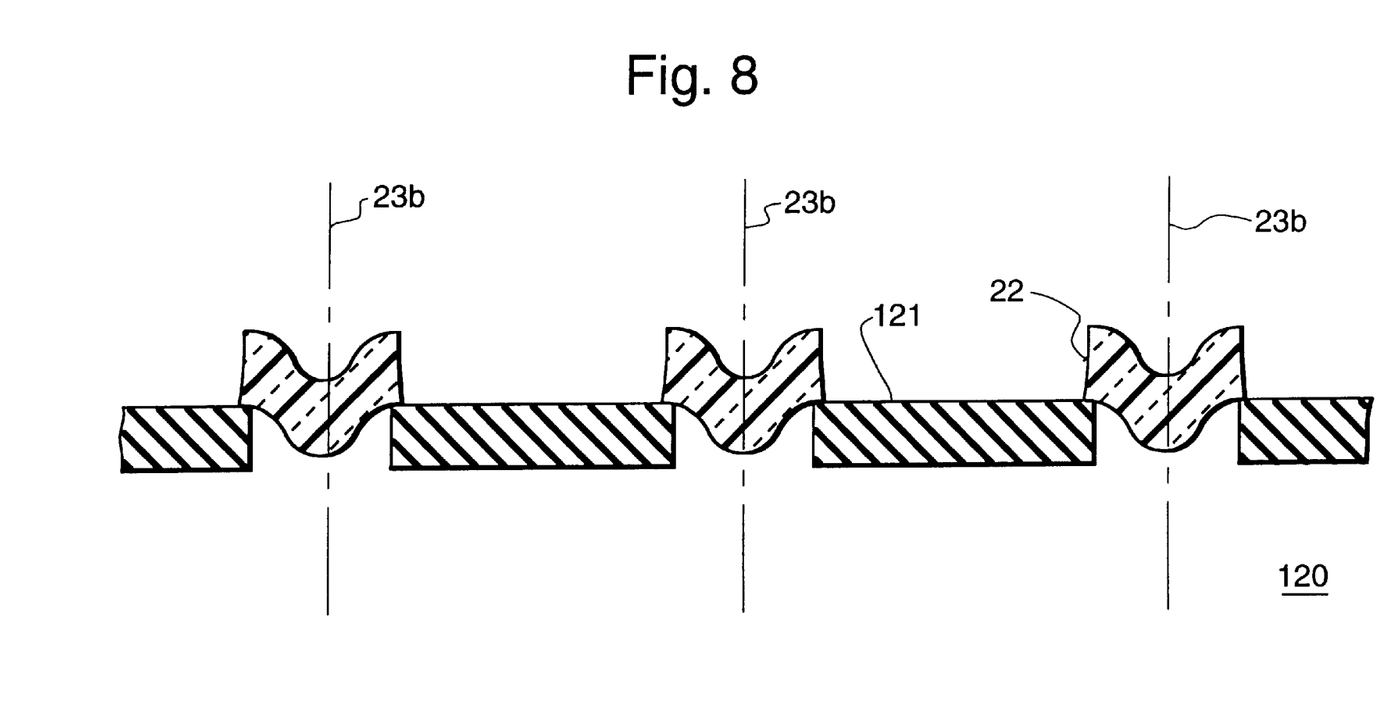
FIG. 8 is a cross-sectional view of a third preferred embodiment of the connector structure having an electrically insulating flat elastic sheet.
Figure 9:
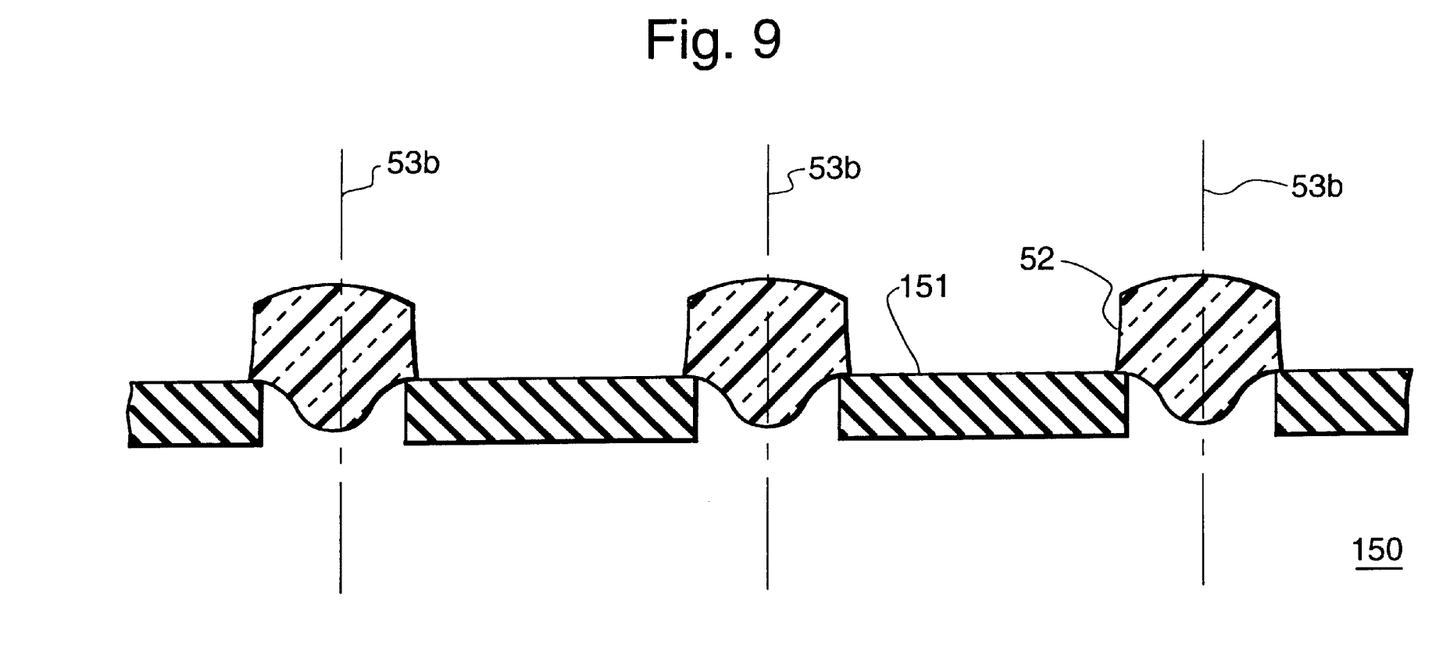
FIG. 9 is a cross-sectional view of a fourth preferred embodiment of the connector structure having an electrically insulating flat elastic sheet.

While it has been described that the electrically insulating elastic sheets 21 and 51 of the connector structure 20 and 50 are formed with projecting portions 23 and 53 shown in FIGS. 2 and 5, respectively, the electrically insulating elastic sheets 21 and 51 may be replaced by flat sheets as shown in FIGS. 8 and 9.

The third preferred embodiment of the connector structure 120 according to the present invention is illustrated in FIG. 8 as comprising an electrically insulating flat elastic sheet 121 and a plurality of electrically conductive elastic bodies 22 which are same as those of the connector structure 20 of the first preferred embodiment of the present invention. The operation of the connector structure 120 is same as that of the connector structure 20, and thus will not be described hereinafter. The elements or parts of the connector structure 120 other than the electrically insulating flat elastic sheet 121 and the electrically conductive elastic bodies 22 in the third preferred embodiment of the connector structure 120 neither shown in FIG. 8 nor appeared in description are same in construction and operation as those of the connector structure 20 shown in FIG. 2 so that the elements or parts of the connector structure 120 will be omitted in description.

The fourth preferred embodiment of the connector structure 150 according to the present invention is illustrated in FIG. 9 as comprising an electrically insulating flat elastic sheet 151 and a plurality of electrically conductive elastic bodies 52 which are same as those of the connector structure 50 of the second preferred embodiment of the present invention. The operation of the connector structure 150 is same as that of the connector structure 50, and thus will not be described hereinafter neither. In a similar reason, the elements or parts of the connector structure 150 other than the electrically insulating flat elastic sheet 151 and the electrically conductive elastic bodies 52 in the fourth preferred embodiment of the connector structure 150 neither shown in FIG. 8 nor appeared in description are same in construction and operation as those of the connector structure 50 shown in FIG. 5 so that the elements or parts of the connector structure 120 will be omitted in description.

While the present invention has thus been shown and described with reference to the specific embodiment, however, it should be noted that the invention is not limited to the details of the illustrated structures but changes and modifications may be made without departing from the scope of the appended claims.

What is claimed is:

1. A connector structure for electrically connecting a pair of electric parts each having a plurality of terminals which can be electrically connected when said electric parts are arranged with said terminals facing and spaced apart from each other, comprising:

an electrically insulating elastic sheet made of an elastic material, and formed with a plurality of through bores respectively facing and spaced apart from said terminals of said pair of electronic parts, each of said through bores having a center axis; and a plurality of electrically conductive elastic bodies each made of an elastic material and each positioned with respect to said electrically insulated elastic sheet to cover each of said through bores of said electrically insulated elastic sheet, said electrically insulated elastic sheet being deformable to have said electrically conductive elastic bodies displaced with respect to said terminals of said electric parts along said center axis of each of said through bores between a first position where said electrically conductive elastic bodies are respectively spaced apart from said terminals of at least one of said electric parts and a second position where said electrically conductive elastic bodies are respectively held in electrical contact with said terminals of said electric parts to complete electrical connection between said electric parts.

2. A connector structure as set forth in claim 1, in which each of said electrically conductive elastic bodies has a portion protruding toward one of said electric parts to facilitate each of said electrically conductive elastic bodies to be brought into contact with each of said terminals of one of said electric parts when said electrically conductive elastic bodies are displaced with respect to said terminals of at least one of said electric parts to assume said second position.

3. A connector structure as set forth in claim 2, in which at least one of said electrically conductive elastic bodies further includes a concavity to engage one of said terminals of the other of said electric parts.

4. A connector structure as set forth in claim 2, in which each of said electrically conductive elastic bodies is formed with a convexity held in contact with each of said terminals of the other of said electric parts.

5. A connector structure as set forth in claim 2, in which each of said terminals of the other of said electric parts is formed with a concavity, and each of said electrically conductive elastic bodies is formed with a convexity identical in profile to said concavity of each of said terminals so that said protruding portion of each of said electrically conductive elastic bodies is received in and registered with said cavity of each of said terminals of the other of said electric parts.

6. A connector structure as set forth in claim 1, in which one of said electronic parts is a semiconductor integrated circuit chip package.

7. A connector structure as set forth in claim 1, in which one of said electronic parts is a semiconductor chip wafer.

8. A connector structure as set forth in claim 1, in which one of said electronic parts is a semiconductor integrated circuit chip.

9. A connector structure for electrically connecting a pair of electric parts each having a plurality of terminals which can be electrically connected when said electric parts are arranged with said terminals facing and spaced apart from each other, comprising:

an electrically insulating elastic sheet having a plurality of projecting portions facing and spaced apart from one of said terminals of said pair of electronic parts, each of said projecting portions being formed with a through bore having a center axis; and a plurality of electrically conductive elastic bodies positioned with respect to said electrically insulating elastic sheet to cover each of said through bores of said electrically insulated elastic sheet, said electrically conductive elastic bodies being displaceable with respect to said terminals of said electric parts along said center axis of each of said through bores between a first position where said electrically conductive elastic bodies are respectively spaced apart from said terminals of at least one of said electric parts and a second position where said electrically conductive elastic bodies are respectively held in electrical contact with said terminals of said electric parts to complete electrical connection between said electric parts.

10. A connector structure as set forth in claim 9, in which each of said electrically conductive elastic bodies has a portion protruded toward one of said electric parts to facilitate each of said electrically conductive elastic bodies to be brought into contact with each of said terminals of one of said electric parts when said electrically conductive elastic bodies are displaced with respect to said terminals of at least one of said electric parts to assume said second position.

11. A connector structure as set forth in claim 10, in which at least one of said electrically conductive elastic bodies further includes a concavity to engage one of said terminals of the other of said electric parts.

12. A connector structure as set forth in claim 10, in which each of said electrically conductive elastic bodies is formed with a convexity held in contact with each of said terminals of the other of said electric parts.

13. A connector structure as set forth in claim 10, in which each of said terminals of the other of said electric parts is formed with a concavity, and each of said electrically conductive elastic bodies is formed with a convexity identical in profile to said concavity of each of said terminals so that said protruding portion of each of said electrically conductive elastic bodies is received in and registered with said cavity of each of said terminals of the other of said electric parts.

14. A connector structure as set forth in claim 9, in which one of said electronic parts is a semiconductor integrated circuit chip package.

15. A connector structure as set forth in claim 9, in which one of said electronic parts is a semiconductor chip wafer.

16. A connector structure as set forth in claim 9, in which one of said electronic parts is a semiconductor integrated circuit chip.

17. A connector structure as set forth in claim 2, in which each of said electrically conductive elastic bodies further includes a concavity to engage one of said terminals of the other of said electric parts.

18. A connector structure as set forth in claim 10, in which each of said electrically conductive elastic bodies further includes a concavity to engage one of said terminals of the other of said electric parts.

* * * * *